United States Patent [19]

Tanaka et al.

[11] Patent Number: 5,151,968
[45] Date of Patent: Sep. 29, 1992

[54] VECTOR QUANTIZATION ENCODER AND VECTOR QUANTIZATION DECODER

[75] Inventors: Yoshinori Tanaka, Kawasaki; Tomohiko Taniguchi, Yokohama; Fumio Amano, Tokyo; Yasuji Ohta, Yokohama; Sigeyuki Unagami, Atsugi, all of Japan

[73] Assignee: Fujitsu Limited, Japan

[21] Appl. No.: 562,604

[22] Filed: Aug. 3, 1990

[30] Foreign Application Priority Data

Aug. 4, 1989 [JP] Japan .................. 1-202418

[51] Int. Cl.⁵ .............................. G10L 3/00
[52] U.S. Cl. .......................... 395/2; 381/31
[58] Field of Search .......... 364/513.5; 381/29–50; 395/2

[56] References Cited

U.S. PATENT DOCUMENTS

| | | | |
|---|---|---|---|
| 3,631,520 | 12/1971 | Atal | 395/2 |
| 4,133,976 | 1/1979 | Atal et al. | 381/47 |
| 4,220,819 | 9/1980 | Atal | 381/38 |
| 4,472,832 | 8/1984 | Atal et al. | 381/40 |
| 4,827,517 | 5/1989 | Atal et al. | 381/49 |
| 4,852,179 | 7/1989 | Fette | 381/29 |
| 4,907,276 | 3/1990 | Aldersberg | 381/31 |
| 4,963,030 | 10/1990 | Makur | 381/31 |
| 4,963,034 | 10/1990 | Cuperman et al. | 381/30 |
| 5,023,910 | 6/1991 | Thomson | 381/37 |

FOREIGN PATENT DOCUMENTS

| | | |
|---|---|---|
| 62-31222 | 2/1987 | Japan . |
| 63-87034 | 4/1988 | Japan . |
| 1-191510 | 8/1989 | Japan . |
| 1-243099 | 9/1989 | Japan . |

OTHER PUBLICATIONS

Schroeder, M. R. and Atal, B. S. "Code-Excited Linear Prediction (Celp): High-Auality Speech at very Low Bit Rates" pp. 937–940 Proceedings of ICASSP '85.
Davidson, G. and Gersho. A. "Complexity Reduction Methods for Vector Excitation Coding" pp. 3055–3058 Proceedings of ICASSP '86.

*Primary Examiner*—Dale M. Shaw
*Assistant Examiner*—David D. Knepper
*Attorney, Agent, or Firm*—Staas & Halsey

[57] ABSTRACT

An apparatus for compressing and decompressing speech signals. The encoder or decoder comprises a plurality of codebooks each controlling a plurality of indexed code vectors for a different frequency band. Each of the codebooks is provided with a synthesis filter for reproducing a signal wave shape based on a code vector provided by the corresponding codebook. The encoder or decoder further comprises an adder for computing a sum of signal wave shapes reproduced by the synthesis filters. This arrangement can reduce the memory size of each codebook used for an encoding or a decoding process and an amount of operations of the encoding or decoding process.

17 Claims, 5 Drawing Sheets

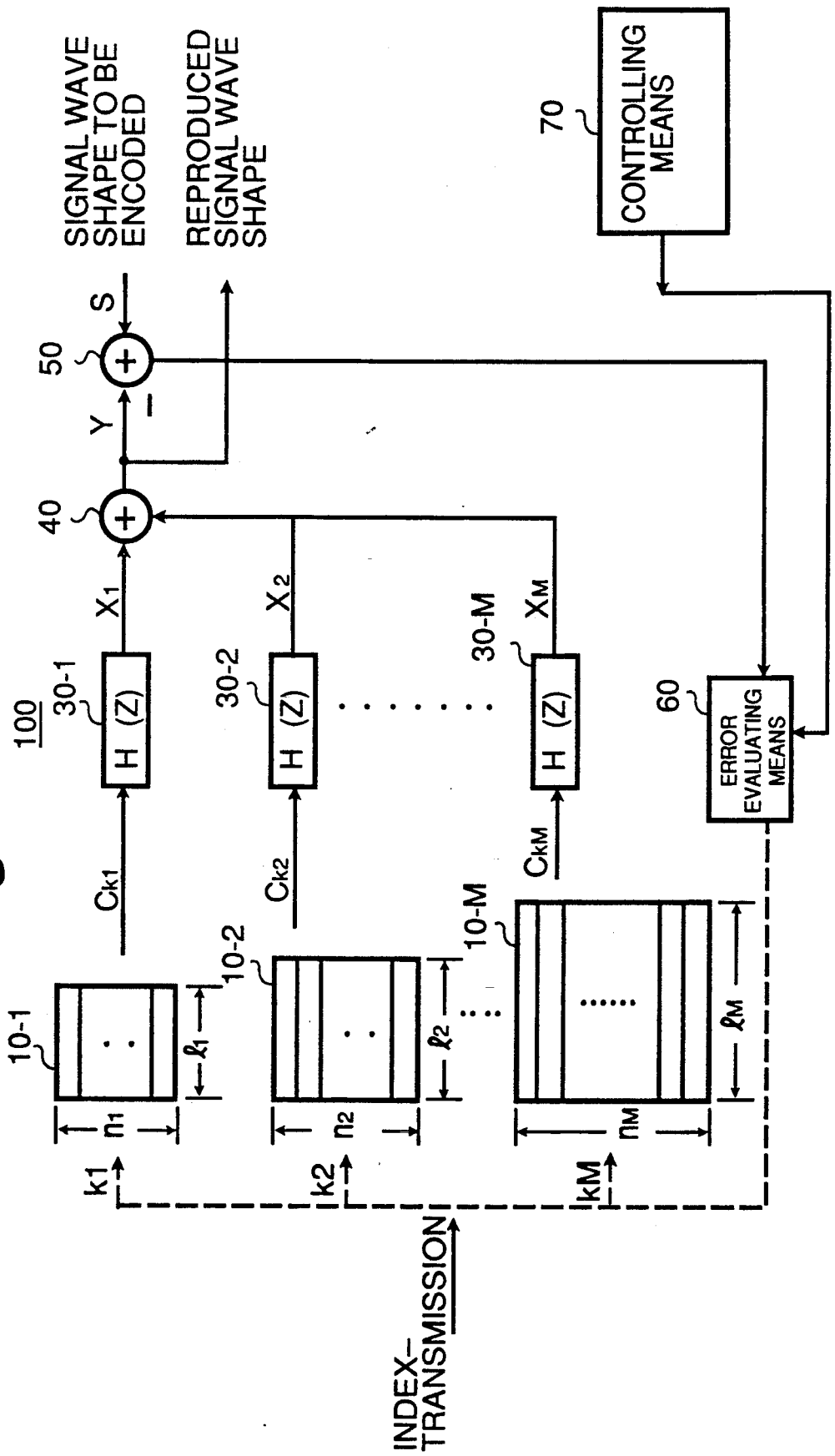

VECTOR QUANTIZATION ENCODER AND VECTOR QUANTIZATION DECODER

BACKGROUND OF THE INVENTION

1. Field of invention

The present invention relates to a vector quantization encoder and a vector quantization decoder employed for compressing and decompressing speech signals etc, and particularly to a vector quantization encoder and a vector quantization decoder that can reduce the memory size of a code book used for carrying out encoding and decoding processes as well as reducing an amount of operations of the encoding and decoding processes.

2. Description of the Related Art

Generally, in a vector quantization device employed for compressing and decompressing speech signals etc, a vector quantization encoder or a vector quantization decoder has a single codebook containing a plurality of code vectors having indices. According to the indices, encoding and decoding processes are carried out. By increasing the quantity of the code vectors stored in the codebook, the quality of a reproduced speech signal may be improved. The increase of the volume of the codebook, however, increases the amount of encoding or decoding operations as well as the hardware volume, thereby impairing the practicality of the system. In designing the vector quantization encoder or decoder, therefore, it is important to maintain the quality of reproduced speech signals while suppressing an increase in the amount of operations or the hardware volume.

FIG. 5 shows a conventional vector quantization encoder employed in a vector quantization device.

In FIG. 5, the vector quantization encoder 100 includes a codebook 1 storing a plurality of code vectors C1 to Cn that are selectively output according to input indices; a synthesis filter 3 that reproduces a speech signal X from a code vector selectively provided by the codebook 1; an error computing means 5 for adding the reproduced speech signal X and a wave shape of an input speech signal to be encoded to each other and computing an error between them; and an error evaluating means 6 for evaluating an error E provided by the error computing means 5.

According to a gain shape vector quantization encoding technique that normalizes energy of each code vector of the codebook 1 and separates an amplification component and phase component from each other, the encoder 100 further includes a gain means 2 for multiplying a normalized code vector from the codebook 1 by a gain (a different gain value being given for each code vector).

In this conventional vector quantization encoder 100, an squared norm Ek (k=1 to n) of an error E of one code vector of the codebook 1 computed by the error computing means 5 is expressed as follows:

$$Ek = S - Xk2$$

The error evaluating means 6 selects an index with which the above equation provides a minimum value. An index for one of the code vectors of the codebook 1 that provides the minimum of the value Ek is selected as a code representing a speech signal to be encoded. In the above equation, the following relation is established:

$$Xk = gHC_k$$

where S is a wave shape of the speech signal to be encoded, H is a impulse response matrix of the synthesis filter, which H is expressed as $$H = \begin{pmatrix} h_0 & o & \ldots & \ldots & o \\ h_1 & h_0 & o & & \cdot \\ h_2 & h_1 & h_0 & o & \cdot \\ & & \cdot & \cdot & \cdot \\ & & & \cdot & \cdot \\ & & & & \cdot & o \\ h_{n-1} & h_{n-2} & \ldots & \cdot & h_o \end{pmatrix}$$

in a from of a lower left side triangle matrix where $h_0, h_1, h_2, \ldots$ are impulse responses of the synthesis filter is a filtering process, g is a gain, and Ck is one code vector of the codebook 1.

Similarly, a conventional vector quantization decoder includes a codebook 1, a gain means 2, and a synthesis filter 3, which are identical with those of the encoder 100. The decoder receives an index encoded by the encoder 100, selects one of code vectors stored in the codebook 1 according to the received index, and reproduces a signal wave shape through the synthesis filter 3.

The conventional vector quantization encoder or decoder has only one codebook 1.

To accurately reproduce an encoded signal wave shape with such a conventional vector quantization encoder or decoder, it is necessary to reduce quantization distortion. To do so, the number of code vectors stored in the codebook 1 must be increased. To increase the number of code vectors, it is necessary to increase the memory size of the codebook 1. This may increase the length of each index, thereby increasing transmission quantities and congesting communication lines. In addition, it increases an amount of operations needed for finding an optimum index as well as a hardware volume.

SUMMARY OF THE INVENTION

To solve the problems of the conventional techniques, an object of the present invention is to provide a practical vector quantization encoder and a practical vector quantization decoder for a vector quantization device that can reproduce high quality signals without increasing an amount of operations and a hardware volume.

To achieve the object, a vector quantization encoder of a vector quantization device according to a first aspect of the present invention basically comprises a codebook storing a plurality of indexed code vectors and providing one of the indexed code vectors in response to an input index signal, a synthesis filter for reproducing a speech signal based on the code vector provided by the codebook, an addition means for adding a wave shape of the reproduced speech signal provided by the synthesis filter to a wave shape of an input speech signal to be encoded, and an evaluating portion for selecting a code vector index which minimizes an error power value between the wave shape of the reproduced speech signal and that of the input speech signal to be encoded and for supplying the selected index to the codebook.

The above codebook includes a plurality of separate codebooks each storing code vectors of a different frequency band. Each of the separate codebooks is provided with the synthesis filter. An addition means is disposed to add reproduced speech signals provided by the synthesis filters to one another and forms a reproduced signal wave shape based on which a minimum error power value is to be found. The evaluating portion includes a means for generating indices for the respective codebooks as well as indices for code vectors of the respective codebooks.

According to a second aspect of the present invention, there is provided a vector quantization decoder of a vector quantization device. The decoder basically comprises a codebook storing a plurality of indexed code vectors, and a synthesis filter for processing a code vector provided by the codebook and reproducing a speech signal. One of the code vectors stored in the codebook is supplied, in response to an input index signal indicating the one code vector, to the synthesis filter, which then reproduces a speech signal wave shape based on the one code vector.

The above codebook involves a plurality of separate codebooks each storing code vectors of a different frequency band. Each of the separate codebooks is provided with the synthesis filter. An addition means is disposed to add reproduced speech signals which are provided by the synthesis filters based on code vectors provided by the corresponding codebooks, to each other, thereby decoding and generating a reproduced speech signal.

Unlike the conventional vector quantization technique that employs a constant number of vectors which cover full signal spectrum to be encoded and produce quantization noise spectrum irrespective of frequencies, the present invention utilizes a fact that noise in a signal band having a large power component (low-band noise) is easily perceived. Based on the fact, the present invention reduces the number of code vectors stored in a codebook for the band of large input power component to carry out rough quantization for the band, and increases the number of code vectors stored in a codebook for the band of small input power component to carry out fine quantization for the band. In this way, the present invention employs a plurality of codebooks for quantization, each of which cover different frequency band and changes the numbers of code vectors stored in the codebooks depending on requirements, thereby reducing the memory size of each codebook and an amount of quantizing operations.

BRIEF DESCRIPTION OF THE DRAWINGS

The above objects and features of the present invention will be more apparent from the following description of the preferred embodiments with reference to the accompanying drawings, wherein:

FIG. 1 is a schematic view showing a principle of the present invention;

DESCRIPTION OF THE PREFERRED EMBODIMENTS

Figure 2A:
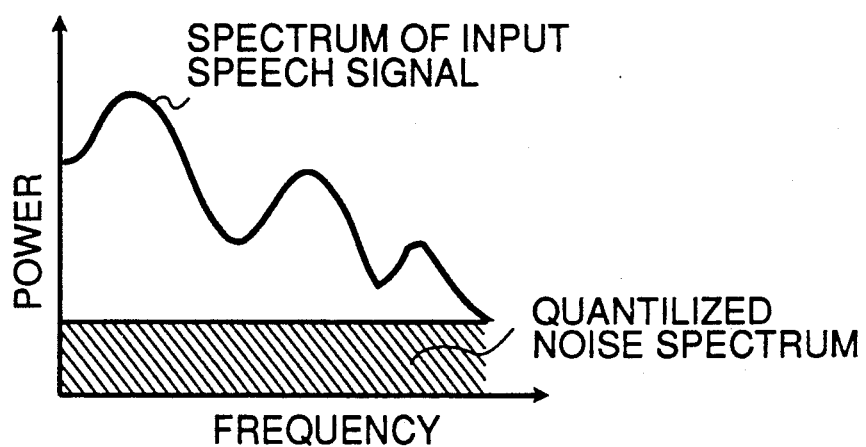
FIGS. 2a and 2b are explanatory views showing a difference between the present invention and a conventional technique.

FIG. 1 is a schematic view showing a principle of the present invention.

In the figure, a reference mark 10-M (M being an integer equal to or larger than 1) denotes one of a plurality of codebooks of the present invention. Each of the codebooks stores a plurality of indexed code vectors. Each codebook 10-M covers and processes code vectors of a different frequency band. If required, one of the codebooks for the frequency band having a large input power component may store a smaller number of code vectors compared to the other codebooks.

In this way, the vector quantization encoder or decoder of the present invention employs a plurality of codebooks (10-1 to 10-M).

According to a first aspect of the present invention, a full frequency band of input speech signal spectrum is properly divided into segments, and each of the segments is allocated to one of the codebooks. According to a second aspect of the present invention, at least one of the codebooks stores a different number of code vectors. When it is required to precisely quantize a particular frequency band of an input speech signal, or when it is allowed to roughly quantize a particular frequency band of the input speech signal, the arrangement of plural codebooks can help reduce the memory size of the encoder or decoder and a processing time.

According to a third aspect of the present invention for further materializing the technical idea of the second aspect, the vector quantization encoder 100 and a vector quantization decoder 200 each employs a plurality of codebooks 10-1 to 10-M each having a different size, i.e., the different number (n1, n2, ..., or nM) of code vectors.

As described before, noise in a low frequency band of an input speech signal is not perceivable, so that the low band of the signal may roughly be quantized. On the other hand, noise in a high frequency band of the input speech signal is easily perceived, so that the high band of the signal must be finely quantized. Accordingly, as shown in FIG. 2(b), the frequency band of an input speech signal is temporarily divided into a low frequency band A, an intermediate frequency band B, and a high frequency band C. The low frequency band A is covered by the codebook 10-1, the intermediate frequency band B by the codebook 10-2, and the high frequency band C by the codebook 10-3 where M=3. In this case, the number "n1" of code vectors stored in the codebook 10-1 is the smallest, the number "n3" where M=3" of the codebook 10-3 M=3 the largest, and the number "n2" of the codebook 10-2 intermediate (n1<n2<n3 M=3).

According to a fourth aspect of the present invention, the dimensions (l) of code vectors stored in the codebooks may be differed from one another. In FIG. 1, the codebook 10-1 has a dimensional number of 11, the codebook 10-2 having 12, and the codebook 10-M having 1M (11<12<1M). Such a combination of dimensional numbers is only an example, and various combinations may be possible. Also, there are optional combinations of the numbers of code vectors (n1 to nM) and the dimensional numbers (11 to 1M).

In FIG. 1, each codebook 10-M is provided with a synthesis filter 30-M to make a pair. The synthesis filter 30-M reproduces a signal wave shape based on a code vector provided by the corresponding codebook 10-M. An addition means 40 adds signal wave shapes reproduced by the synthesis filters to one another and provides a sum of them. An error computing means 50 corresponding to the error computing means 5 of FIG. 5 computes an error between a reproduced signal wave shape Y provided by the addition means 40 and a wave shape S of a signal to be encoded. An error evaluating means 60 corresponding to the error evaluating means 6 of FIG. 5 selects code-vectors for the codebooks so that a squared norm of error vector computed by the error computing means 50 may be minimized. A controlling means 70 successively selects combinations of code vectors for the codebooks, reads a selected combination of code vectors out of the codebooks, and provides the read code vectors to the synthesis filters.

More precisely, the controlling means 70 and error evaluating means 60 select code vectors among those stored in the codebooks 10-1 to 10-M in a way of minimizing the squared norm of error vector $E_{K1, K2, \ldots, KM}$ of the previously described equation. When the selected code vectors are decided to be those with which the squared norm of error vector is minimized, the error evaluating means 60 supplies indices of the decided code vectors to the codebooks to reproduce a speech signal wave shape.

Practically, according to a combination of code vectors selected from the respective codebooks, a value $E_{K1, K2, \ldots, KM}$ for the combination is computed. Thereafter, another combination of code vectors is selected from the respective codebooks, and an squared norm $E_{K1, K2, \ldots, KM}$ for the combination is computed. In this way, squared norm of error vector $E_{K1, K2, \ldots, KM}$ are computed for all combinations of the code vectors.

In the vector quantization decoder 200 (FIG. 4), the addition means 40 may compute a sum of code vectors provided by the codebooks. In this case, a single synthesis filter 30-M is disposed to reproduce a speech signal from the sum of the code vectors. When energy of respective code vectors of the codebooks is normalized, a gain means corresponding to the gain means 20-M of FIG. 5 is disposed for each codebook 10-M.

In the vector quantization encoder 100 of the present invention, the controlling means 70 instructs each of the M codebooks 10-1 to 10-M to provide a code vector Cki. Thereafter, each of the synthesis filters 30-1 to 30-M filters a corresponding code vector CkM to provide a corresponding signal wave shape Xi(Si=H·Ck$_j$) where H is a impulse response matrix of the synthesis filter 30-$i$, which is multiplied by a gain gi if a gain means is disposed) (i=1∼M). In this way, the synthesis filter 30-$i$ reproduces the signal wave shape Xi based on the corresponding code vector selected from the codebook 10-$i$. The addition means 40 computes a sum of the signal wave shapes Xi and provides a reproduced signal wave shape. The error computing means 50 computes an error vector between the reproduced signal wave shape and the wave shape of a signal to be encoded. Among errors thus computed, the error evaluating means 60 detects a minimum one and specifies a combination of code vectors of the codebooks that provides the minimum error. A combination of indices corresponding to the specified code vectors of the codebooks is encoded into a code to be transmitted.

The vector quantization decoder 200 of the present invention employs codebooks 10-1 to 10-M of the identical number and arrangement as those of the vector quantization encoder 100. When the codebooks of the decoder 200 receive the code representing the combination of the code vector indices, the respective codebooks provide code vectors specified by the received indices to corresponding synthesis filters 30-$i$ (1=1∼M). In this way, each of the codebooks 10-$i$ provides one code vector Cki. According to the same process as the encoding process, the synthesis filters 30-$i$ filter the provided code vectors Cki and reproduce corresponding signal wave shapes Xi. An addition means 40 computes a sum of the signal wave shapes Xi, thereby reproducing a wave shape of the signal to be decoded.

The addition means 40 of the vector quantization decoder 200 according to the present invention may compute a sum of code vectors provided by the codebooks 10-$i$(1=1∼M). In this case, a single synthesis filter filters the sum of the code vectors, thereby reproducing a wave shape of the signal to be decoded.

As described above, the present invention has a plurality of codebooks 10-1 to 10-M used for encoding or decoding processes. The addition means 40 of the present invention achieves the same controlling function as that provided by one disposed in the conventional single codebook structure. Supposing the conventional codebook controls 210 code vectors, the present invention controls the same code vectors with, for example, two codebooks in which one codebook 10-1 controls, for example, 25 code vectors for law frequency band and the other codebook 10-2 controls the remaining 25 code vectors for high frequency band. Consequently, the number of code vectors stored in each codebook 10-$i$ can remarkably be reduced compared to the conventional single codebook arrangment. This greatly reduces the memory size of the codebook 10-$i$.

According to the present invention, each codebook 10-$i$ does not cover full input signal spectrum band width but, for example, the codebook 10-1 controls code vectors in a band from 0 KHz to 4 KHz, and the codebook 10-2 controls code vectors in a band from 4 KHz to 8 KHz. In this way, each codebook covers code vectors of its own band.

As is well known as Shannon's sampling theorem, a continuous signal must be sampled at a frequency two times the maximum frequency of the signal to be sampled.

In encoding a signal having a maximum frequency of 8 KHz, therefore, the conventional single codebook structure for covering whole signal spectrummust store code vectors sampled at 16 KHz. On the other hand, the codebook 10-1 of the present invention (for above example case of M=2) may store code vectors sampled at 8 KHz that is twice 4 KHz, and the codebook 10-2 may store code vectors sampled at 16 KHz that is twice 8 KHz. As is apparent from this example, according to the codebooks 10-$i$ of the present invention, (1=1∼n) the dimension (li in FIG. 1) of each code vector can be shortened compared to that of the conventional codebook. From this point also, the present invention can greatly reduce the memory size of each codebook.

In addition, the present invention sets the number of code vectors stored in one codebook that covers a band of large input power component to be smaller than those of other codebooks. Generally, noise in a signal band having a large electric power component is not perceivable compared to noise in a signal band having a small electric power component. By utilizing this fact, the present invention differently sets the numbers of code vectors of respective codebooks. Namely, the number of code vectors stored in a codebook 10-$i$ for a band of large electric power component is reduced.

Figure 2B:
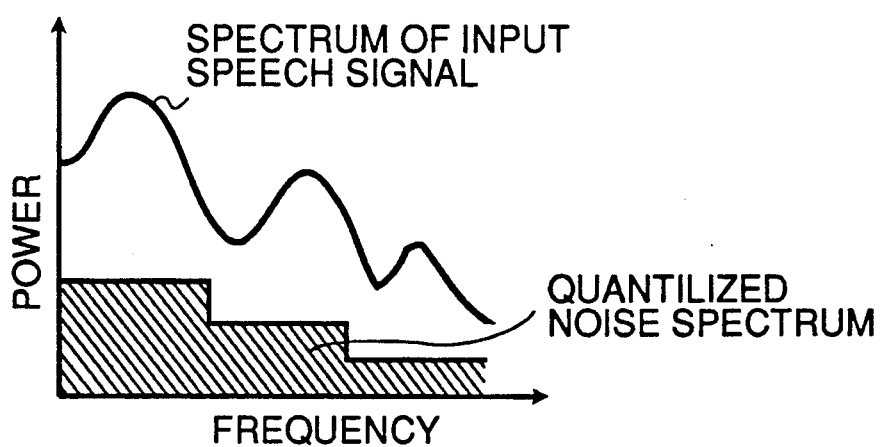

For example, for a speech signal having a low frequency and large electric power component, the conventional codebook shows constant quantization noise spectrum irrespective of the frequency, as shown in FIG. 2(a). According to the codebooks 10-$i$(i=1~M) of the present invention, however, quantization noise spectrum increases as the frequency decreases, as shown in FIG. 2(b). With this arrangement, the total number of code vectors stored in the codebooks 10-$i$(i=1~M) can further be reduced compared to that of the single codebook structure. From this point also, the present invention can reduce the memory size of each codebook.

As described above, the present invention can greatly reduce the memory size of each codebook compared to the conventional technique. Accordingly, an operation time necessary for encoding and decoding processes can greatly be reduced.

EXAMPLES

The present invention will be described in detail according to embodiments for encoding speech signals.

Figure 3:
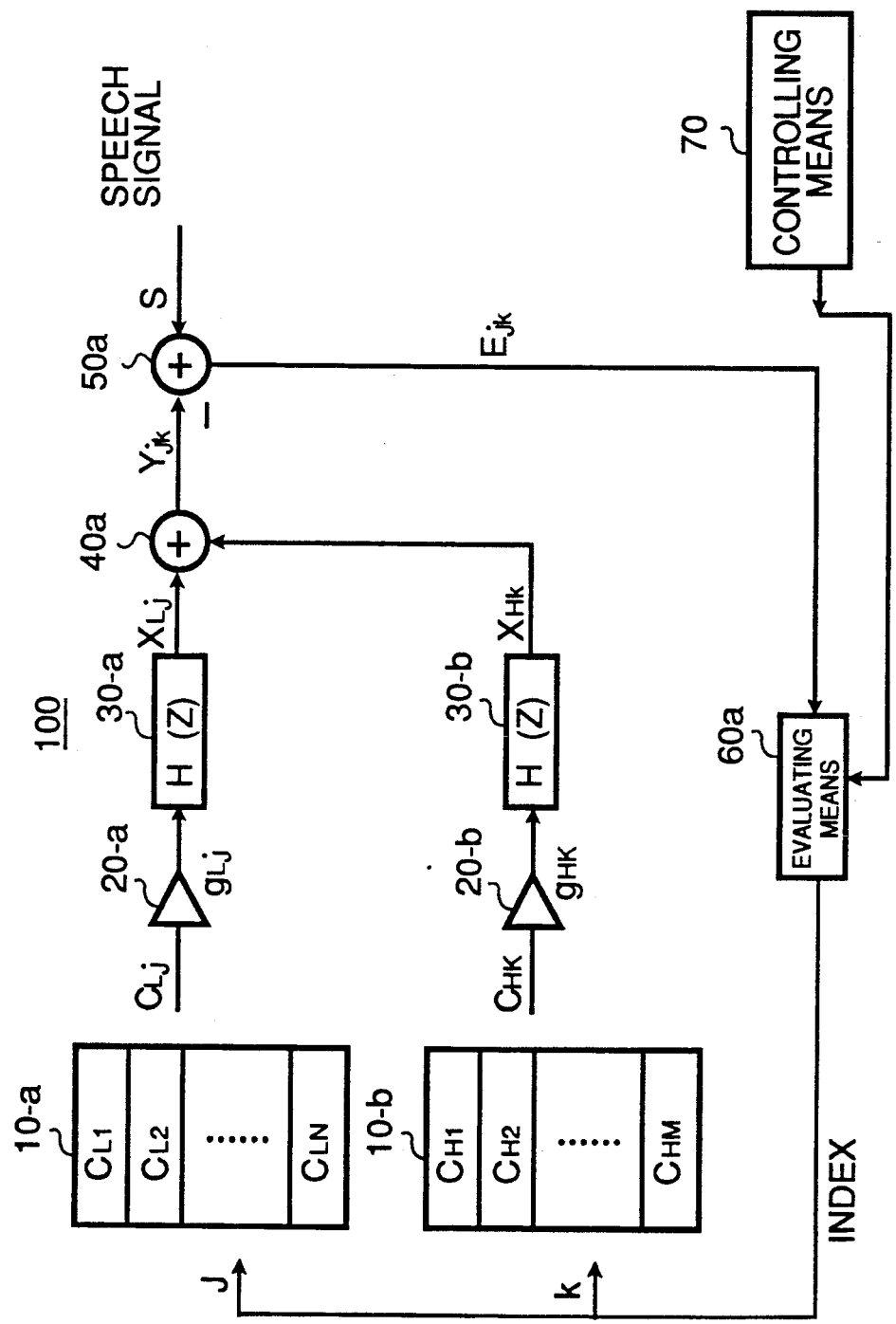
FIG. 3 is a schematic view showing a vector quantization encoder according to an embodiment of the present invention.

FIG. 3 shows a vector quantization encoder according to an embodiment of the present invention. In the figure, a low-frequency-band codebook 10-$a$ controls N pieces of indexed code vectors in a band from 0 KHz to 2 KHz. A high-frequency-band codebook 10-$b$ controls Nb pieces of indexed code vectors in a frequency band from 2 KHz to 4 KHz. For the sake of simplicity of explanation, the codebook 10-$a$ stores the following code vectors CLj (j being an index taking any integer between 1 to Nb) sampled according to amplitude information at "p" sampling points:

CLj=(aj1, aj2, ... ajp) On the other hand, the codebook 10-$b$ stores the following code vectors CHk (k being an index taking any integer between 1 to M) sampled according to amplitude information at "q" sampling points:

$$CHk = (bk1, bk2, \ldots, bkq)$$

Here, the Shannon's sampling theorem establishes a relation of "q=2×p." According to characteristics of speech signals, an long time averaged electric power component of the frequency band from 0 KHz to 2 KHz is larger than that of the frequency band from 2 KHz to 4 KHz. This provides a hearing masking effect so that the frequency band from 0 KHz to 2 KHz may allow larger noise. Taking this effect into consideration, the number Nb of code vectors of the codebook 10-$a$ is set to be smaller than the number M of code vectors stored in the codebook 10-$b$.

A low-frequency-band gain means 20-$a$ multiples a code vector CLj of the codebook 10-$a$ by a gain gLj. A high-frequency-band gain means 20-$b$ multiplies a code vector CHk of the codebook 10-$b$ by a gain gHk. A low-frequency-band synthesis filter 30-$a$ filters an output of the gain means 20-$a$ and reproduces a signal wave shape based on the code vector provided by the codebook 10-$a$. A high-frequency-band synthesis filter 30-$b$ filters an output of the gain means 20-$b$ and reproduces a signal wave shape based on the code vector provided by the codebook 10-$b$. A signal wave shape XLj reproduced by the synthesis filter 30-$a$ is expressed as follows:

$$XLj = gLj \times H \cdot CLj$$

A signal wave shape XHk reproduced by the synthesis filter 30-$b$ is expressed as follows:

$$XHk = gHk \times H \cdot CHk$$

where H is a impulse response matrix of the synthesis filter.

A low-frequency-band and high-frequency-band addition means 40$a$ adds the two signal wave shapes reproduced by the synthesis filters 30-$a$ and 30-$b$ to each other. The addition means 40$a$ provides a reproduced signal Yjk expressed as follows:

$$Yjk = XLj + XHk$$

A speech signal error computing means 50$a$ computes an error squared norm Ejk between the reproduced signal Yjk provided by the addition means 40$a$ and a wave shape S of a speech signal to be encoded. The error squared norm Ejk computed by the error computing means 50$a$ is expressed as follows:

$$Ejk = \| S - Y_{jk}^2 \|$$

A minimum distortion evaluating means 60$a$ corresponding to the error evaluating means 60 of FIG. 1 finds the indices (j, k) and gain values (gLj, gHk) of code vectors that provide a minimum error squared norm Ejk. Numeral 70 denotes a controlling means corresponding to that of FIG. 1.

An operation of the above vector quantization encoder of the present invention will be explained.

In a first cycle, the controlling means 70 selects a code vector CL1 from the codebook 10-$a$ and a code vector CH1 from the codebook 10-$b$ and, in the next cycle, the code vector CL1 from the codebook 10-$a$ and a code vector CH2 from the codebook 10-$b$. In this way, the controlling means 70 successively selects pairs of code vectors (CLj, CHk) from the codebooks 10-$a$ and 10-$b$. Namely, it selects "N×Nb" combinations of code vectors.

When a combination of code vectors (CLj, CHk) is selected, the gain means 20-$a$ multiplies the code vector CLj selected from the codebook 10-$a$ by a gain gLj, and the gain means 20-$b$ multiplies the code vector CHk selected from the codebook 10-$b$ by a gain gHk. Thereafter, the synthesis filter 30-$a$ filters an output of the gain means 20-$a$ and reproduces a signal wave shape XLj corresponding to the code vector CLj of the codebook 10-$a$. The synthesis filter 30-$b$ filters an output of the gain means 20-$b$ and reproduces a signal wave shape XHk corresponding to the code vector CHk of the codebook 10-$b$.

The addition means 40$a$ finds a sum of the two reproduced signal wave shapes and provides a reproduced signal Yjk. The speech signal error computing means 50$a$ computes an error squared norm Ejk between the reproduced signal Yjk and a signal wave shape S of a speech signal to be encoded, and provides an error squared norm Ejk to the minimum distortion evaluating means 60$a$. In this way, the minimum distortion evaluating means 60$a$ successively receives "N×Nb" error electric power values Ejk.

After receiving each error squared norm Ejk, the minimum distortion evaluating means 60$a$ resolves an equation that zeros a partial differentiation of the error squared norm Ejk with gLj and gHk, thereby finding values of the gains gLj and gHk that minimize the error squared norm Ejk. The error squared norm Ejk at this time is also found. The minimum distortion evaluating means 60a specifies the index values and gain values that provide the minimum of "N×Nb" minimum error squared norm Ejk, and encodes the specified values, thereby completing an encoding process of the speech signal to be encoded.

Figure 4:
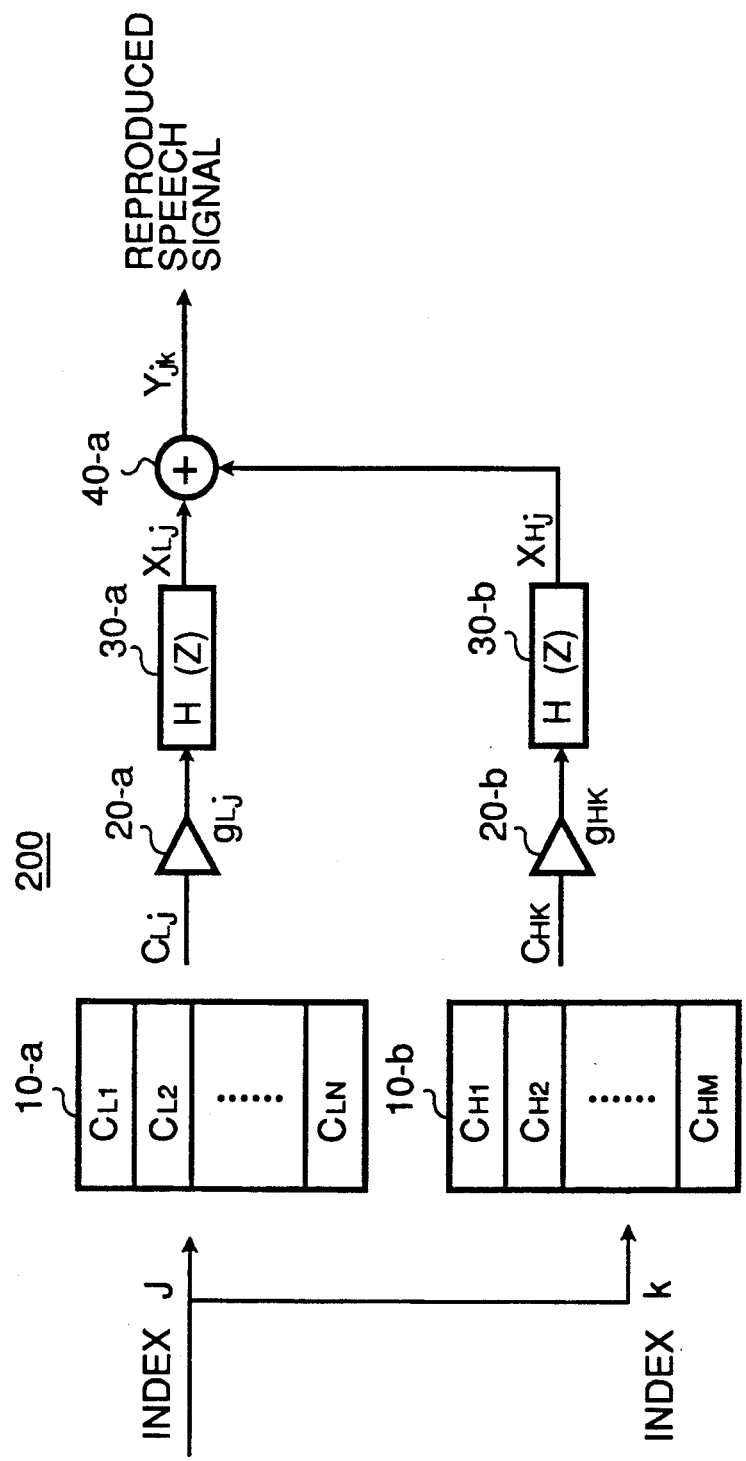
FIG. 4 is a schematic view showing a vector quantization decoder according to an embodiment of the present invention.
Figure 5:
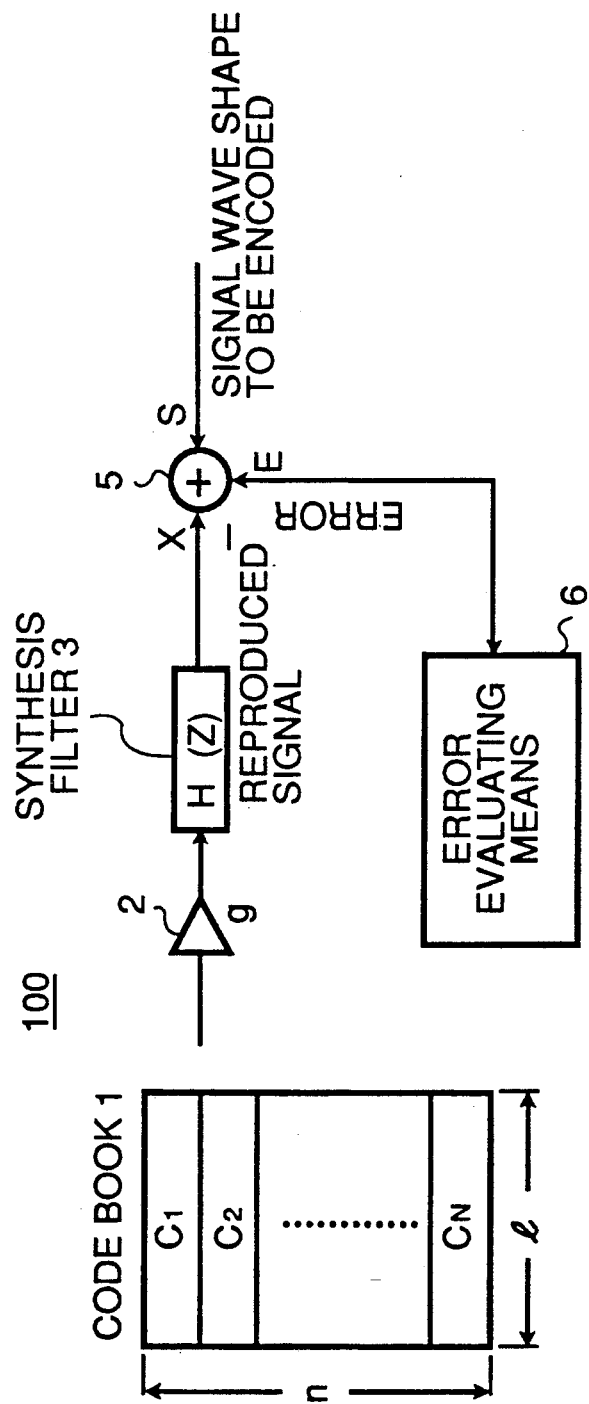
FIG. 5 is a schematic view showing a conventional technique.

FIG. 4 shows a vector quantization decoder 200 according to an embodiment of the present invention. In the figure, the same parts as those of FIG. 3 are represented with like reference marks. An operation of the vector quantization decoder will be explained.

The vector quantization decoder 200 receives codes (involving index values and gain values) from the vector quantization encoder 100. The decoder reads a code vector CLj from a low-frequency-band codebook 10-a according to the received index, and a code vector CHk from a high-frequency-band codebook 10-b according to the received index. A received gain gLj is set in a low-frequency-band gain means 20-a, and a received gain gHk is set in a high-frequency-band gain means 20-b. Thereafter, similar to the vector quantization encoder 100 of FIG. 3, a low-frequency-band synthesis filter 30-a reproduces a signal wave shape XLj from the specified code vector CLj, and a high-frequency-band synthesis filter 30-b reproduces a signal wave shape XHk from the specified code vector CHk. An addition means 40a finds a sum of the two reproduced signal wave shapes and provides a reproduced speech signal Yjk, thereby completing a decoding process of the speech signal.

The vector quantization decoder 200 of the present invention shown in FIG. 4 has two synthesis filters, i.e., the synthesis filter 30-a corresponding to the codebook 10-a and the synthesis filter 30-b corresponding to the codebook 10-b. The addition means 40a finds a sum of signal wave shapes reproduced by the two synthesis filters. As explained before with reference to FIG. 1, only one synthesis filter may be sufficient if the addition means 40a is disposed in front of the synthesis filter.

As described above, the present invention arranges a plurality of codebooks for a vector quantization encoding process or a vector quantization decoding process. In addition, the present invention arranges a means for adding signals reproduced from code vectors of the codebooks to each other. This arrangement can realize the same controlling function as that realized by the single codebook arrangement. Consequently, the present invention can greatly reduce the memory size of each codebook.

The present invention is not limited to the preferred embodiments explained with reference to the accompanying drawings. For example, it is allowable not to follow the gain shape vector quantization encoding technique. When this technique is not involved, it is not necessary to encode gain values. In addition, the present invention is applicable for not only speech signals but also other signals.

Unlike the above embodiments, the sizes of codebooks, i.e., the numbers of code vectors and/or dimensions of the codebooks of the quantization encoder and decoder of the present invention may be set sufficiently large to meet expected maximums. And these numbers may at any time and continuously be changed depending on an instantaneous spectrum distribution of input speech signals and electric power of the input speech signals for respective frequency bands covered by the codebooks.

In FIG. 2(b), the number of code vectors of a lower band codebook is set to be smaller than that of a higher band codebook. If, for example, an input signal level of an intermediate band becomes highest at one instant, the number of code vectors of the intermediate codebook may be increased at the instant depending on an electric power level of the signal. In this way, the sizes of the respective codebooks are flexibly changed.

As described above, the present invention can maintain the quality of reproduced signals while greatly reducing the memory size of each codebook used for encoding and decoding processes, compared with conventional techniques. The present invention can, therefore, reduce an operation time of the encoding and decoding processes, thereby realizing a practical vector quantization encoder and vector quantization decoder.

We claim:

1. A vector quantization encoder in a vector quantization device comprising:

codebook means for storing a plurality of indexed code vectors and for providing one of the indexed code vectors in response to an code vector index signal, synthesis filters for reproducing speech signals based on the indexed code vector provided by said codebook means, addition means for adding the reproduced speech signals provided by said synthesis filters together to form a reproduced speech signal, error computing means for receiving an input speech signal and for computing a minimum error power valve by determining a difference between the reproduced speech signal and the input speech signal; and evaluating means for selecting the code vector index which minimizes the minimum error power value due to the difference between the reproduced speech signal and the input speech signal to be encoded and for supplying the selected code vector index to said codebook means, wherein:

said codebook means includes a plurality of separate codebooks, each stores indexed code vectors for a different frequency band;

each of said separate codebooks is provided with one of said synthesis filters;

said addition means forms the reproduced speech signal based on which the minimum error power value is to be found; and said evaluating means includes means for selecting indices corresponding to said respective separate codebooks as well as indices for the indexed code vectors of said respective separate codebooks based on the minimum error power value.

2. A vector quantization encoder according to claim 1, wherein at least one of said separate codebooks has a different number of the indexed code vectors from the rest of said separate codebooks.

3. A vector quantization encoder according to claim 2, wherein each of said separate codebooks has a different number of the indexed code vectors.

4. A vector quantization encoder according to claim 2, wherein each of said separate codebooks has indexed code, vectors of different dimension.

5. A vector quantization encoder according to claim 1, wherein a number of the indexed code vectors stored in said separate codebooks varies depending on a frequency band of input speech signals.

6. A vector quantization encoder according to claim 1, wherein an usable number of the indexed code vectors of each of the separate codebooks is variable in response to a level of the input speech signal.

7. A vector quantization decoder in a vector quantization device, comprising:

codebook means for storing a plurality of indexed code vectors, synthesis filters for processing the indexed code vectors provided by said codebook means and for reproducing a speech signal, one of the indexed code vectors stored in said codebook means being supplied to the synthesis filter, which then reproduces the speech signal based on the one of the indexed code vectors, wherein:

said codebook means includes a plurality of separate codebooks, each storing a portion of the indexed code vectors for a different frequency band;

each of said separate codebooks is provided with one of said synthesis filters; and addition means for adding the reproduced speech signals which are provided by said synthesis filters to each other.

8. A vector quantization decoder according to claim 7, wherein at least one of said separate codebooks has a different number of the indexed code vectors from the rest of said separate codebooks.

9. A vector quantization decoder according to claim 8, wherein each of said separate codebooks has a different number of the indexed code vectors.

10. A vector quantization decoder according to claim 7, wherein a number of the indexed code vectors stored in any one of said separate codebooks varies depending on a frequency band of input speech signals.

11. A vector quantization decoder according to claim 7, wherein an usable number of the indexed code vectors of each of said separate codebooks is variable in response to a level of the input speech signal to be encoded.

12. A vector quantization decoder according to claim 7, wherein each of said separate codebooks has code vectors of different dimensions.

13. A vector quantization encoder in a vector quantization device, comprising:

codebook storing means for storing a plurality of indexed code vectors and for selectively providing code vectors in response to code vector indices and including a plurality of separate codebooks, each storing a portion of the indexed code vectors corresponding to a different frequency band;

synthesis filters connected to provide respective signal wave shapes based on corresponding one of the code vectors;

addition means for providing a reproduced signal wave shape responsive to signal wave shapes provided by said synthesis filters;

error computing means for receiving an input speech signal and for providing an error vector responsive to adding the reproduced signal wave shape to the input speech signal;

error evaluating means for selecting the code vector indices responsive to minimizing a squared norm of the error vector; and controlling means for selecting combinations of the code vector indices.

14. A vector quantization encoder according to claim 13, wherein at least one of said separate codebooks has a different number of the indexed code vectors from the rest of said separate codebooks.

15. A vector quantization encoder according to claim 13, further comprises:

gain means for multiplying each of the code vectors by a gain, and wherein:

said synthesis filters, each reproduces the signal wave shape based on the corresponding one of the code vectors multiplied by said gain means.

16. A vector quantization decoder in a vector quantization device, connectable to receive code vector indices, comprising:

codebook storing means for storing a plurality of indexed code vectors and for providing code vectors selected from the indexed code vectors based on the code vector indices and including a plurality of separate codebooks, each storing a portion of the indexed code vectors corresponding to a different frequency band;

gain means for providing gain code vectors responsive to multiplying a gain and the code vectors;

synthesis filters, each connected to receive one of corresponding gain code vectors to reproduce a signal wave shape; and addition means for providing a reproduced speech signal responsive to adding signal wave shape reproduced by said synthesis filters.

17. A vector quantization encoder according to claim 16 wherein at least one of said separate codebooks has a different number of the indexed code vectors from the rest of said separate codebooks.

* * * * *